(12) United States Patent
Wilson et al.

(10) Patent No.: US 6,282,099 B1
(45) Date of Patent: Aug. 28, 2001

(54) STRUCTURE FOR MOUNTING AND METHOD FOR INSTALLING A CIRCUIT CARD

(75) Inventors: Richard M. Wilson, Caldwell; Don E. Saunders, Boise, both of ID (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/079,810

(22) Filed: May 15, 1998

(51) Int. Cl.[7] ................................................. H05K 5/00
(52) U.S. Cl. .......................... 361/753; 361/752; 361/727; 361/807; 361/825; 439/260; 439/341; 439/342
(58) Field of Search ..................................... 361/727, 752, 361/736, 737, 753, 756, 759, 807, 825; 439/326, 341, 376, 260, 342

(56) References Cited

U.S. PATENT DOCUMENTS

| | | | |
|---|---|---|---|
| 4,602,351 | * 7/1986 | Shimamura et al. | 365/52 |
| 4,979,075 | * 12/1990 | Murphy | 361/759 |
| 5,012,078 | * 4/1991 | Pernet | 235/441 |
| 5,161,169 | * 11/1992 | Galano et al. | 375/8 |
| 5,400,216 | * 3/1995 | Tsai | 361/684 |
| 5,421,737 | * 6/1995 | Chen et al. | 439/157 |
| 5,443,395 | * 8/1995 | Wang | 439/159 |
| 5,559,317 | * 9/1996 | Wong et al. | 235/449 |
| 5,642,259 | * 6/1997 | Ma | 361/686 |
| 5,674,080 | * 10/1997 | Takemura | 439/159 |
| 5,870,284 | * 2/1999 | Stewart et al. | 361/699 |
| 5,967,812 | * 10/1999 | Tung et al. | 439/159 |
| 6,078,504 | * 6/2000 | Miles | 361/727 |

* cited by examiner

Primary Examiner—Jeffrey Gaffin
Assistant Examiner—Tuan Dinh

(57) ABSTRACT

A structure for mounting a circuit card. The structure includes a track in which the circuit card may slide and pivot. The card slides into the track and then pivots to engage electrical contacts on the body of the circuit card, rather than on the edge of the card, to mating contacts on the main circuit board in the computer, printer or other electronic device.

3 Claims, 11 Drawing Sheets

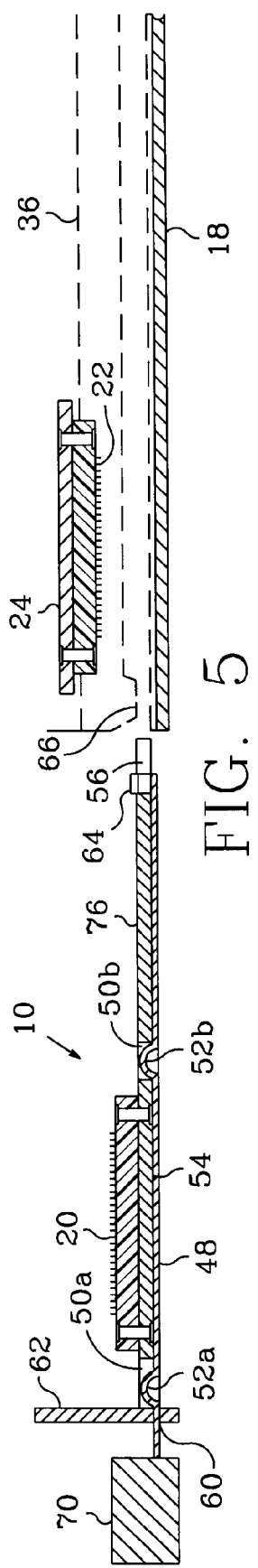
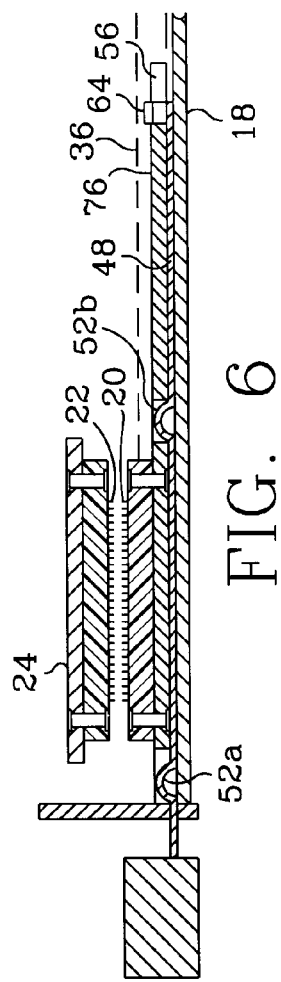
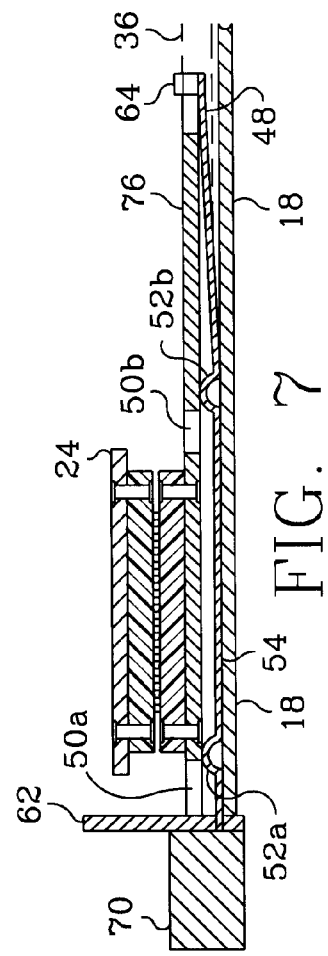
FIG. 5
FIG. 6
FIG. 7

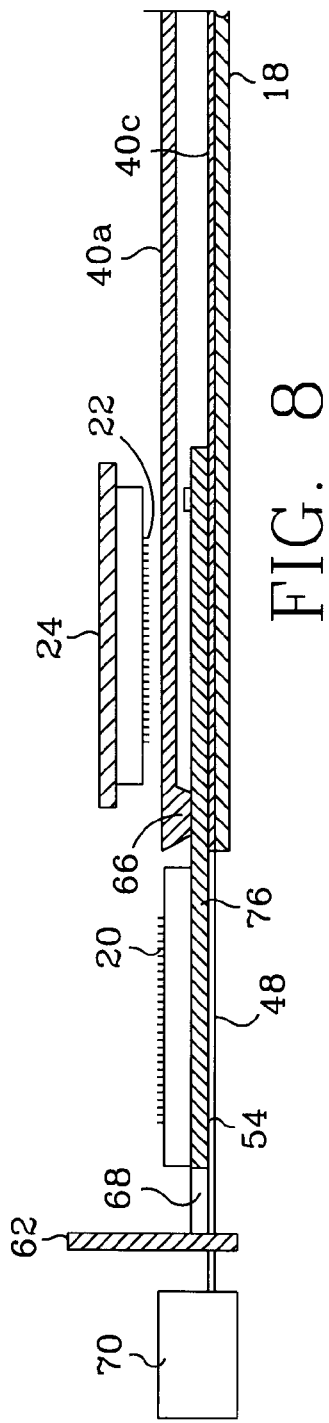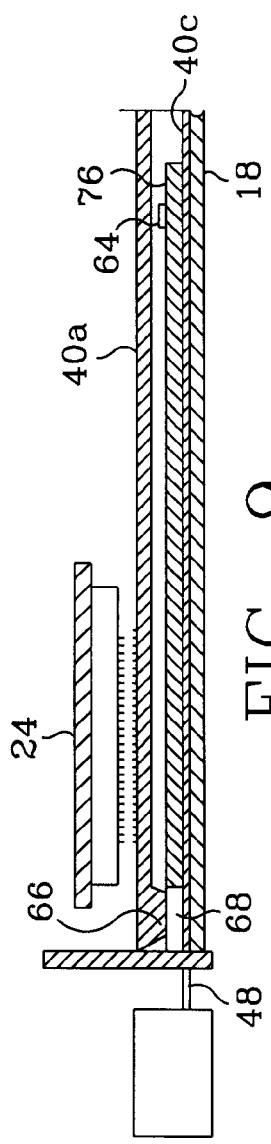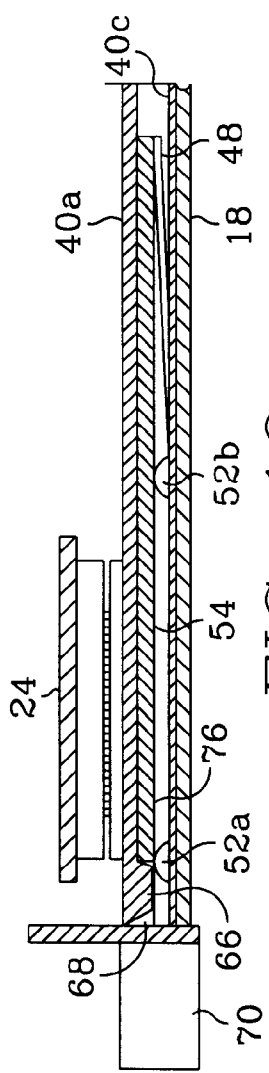

STRUCTURE FOR MOUNTING AND METHOD FOR INSTALLING A CIRCUIT CARD

FIELD OF THE INVENTION

The invention relates generally to mounting and installing circuit cards in electronic equipment. More particularly, the invention relates to a multi-axis interconnection that facilitates the installation of circuit cards into computers, printers, and other types of electronic equipment.

BACKGROUND OF THE INVENTION

Computers, printers, facsimile machines and similar types of electronic equipment include electronic circuits and components formed in or mounted on a main circuit board. In a personal computer the microprocessor chip and the random access memory chips, for example, are mounted on the main circuit "mother" board. In a laser printer, the main circuit board is typically the formatter board. The formatter board includes the microprocessor and related memory chips that control the functions of the printer. Other circuits and components are often mounted on circuit cards that are plugged into the main circuit board. Modem cards, network cards, infrared connectivity cards and other option cards are examples of circuit cards that might be used in a computer or printer.

Option cards are usually plugged into the main circuit board with some type of socket connector. Edge connectors in which electrical contacts along the edge of the card are plugged into a mating female socket mounted on the main circuit board are the most common card connectors in computers. Usually, a cover and screws must be removed and reinstalled to access the female socket on the main circuit board to install the option card. It is desirable to eliminate or at least minimize the need for tools and screws during customer installation of circuit cards. In some printers, the circuit card edge contacts are plugged into sockets at the back of the frame tray in which the formatter board is fastened. Circuit cards used in these printers must be large enough to reach the sockets even if this size is not necessary to accommodate the circuitry and electronic components on the card. The formatter board or ribbon cable from the formatter board must also extend to the connector at the back of the frame. It would be advantageous to mount the circuit card and make electrical contact to the formatter or main circuit board independent of the size of the frame.

SUMMARY OF THE INVENTION

Accordingly, the present invention is directed to a structure for mounting and a method for installing a circuit card. The structure includes a track in which the circuit card may slide and pivot. The card slides into the track and then pivots to engage electrical contacts on the body of the circuit card, rather than on the edge of the card, with mating contacts on the main circuit board in the computer, printer or other electronic device. The invention makes it possible to position the electrical contacts at various locations on the circuit card as necessary or desirable to accommodate the computer or printer frame size and/or the preferred location of the contacts on the main circuit board.

In one embodiment of the invention, the track includes a first channel guide and a second channel guide. Each channel guide may be characterized by a lengthwise dimension from front to back and a transverse dimension perpendicular to the lengthwise dimension and perpendicular to the plane of the circuit card. For those applications in which the circuit card will pivot along its back edge to engage the contacts, the transverse dimension at the front of the guides is made greater than the thickness of the circuit card and the transverse dimension at the back of the guide is nominally equal to the thickness of the circuit card. This creates a V (laid on its side) shaped track. The circuit card slides into the track along the lengthwise dimension and pivots in the track on its back edge in the transverse dimension. For those applications in which the circuit card will pivot along one of its side edges, the first channel guide has a transverse dimension nominally equal to the thickness of the circuit card and the second channel guide has a transverse dimension greater than the thickness of the circuit card. In this configuration, the circuit card pivots in the track on a side edge in the transverse dimension.

DESCRIPTION OF THE DRAWINGS

FIGS. 5–10 are section views of the first embodiment of the interconnection showing insertion of the option card and engagement of the electrical contacts.

DETAILED DESCRIPTION OF THE INVENTION

Figure 1:
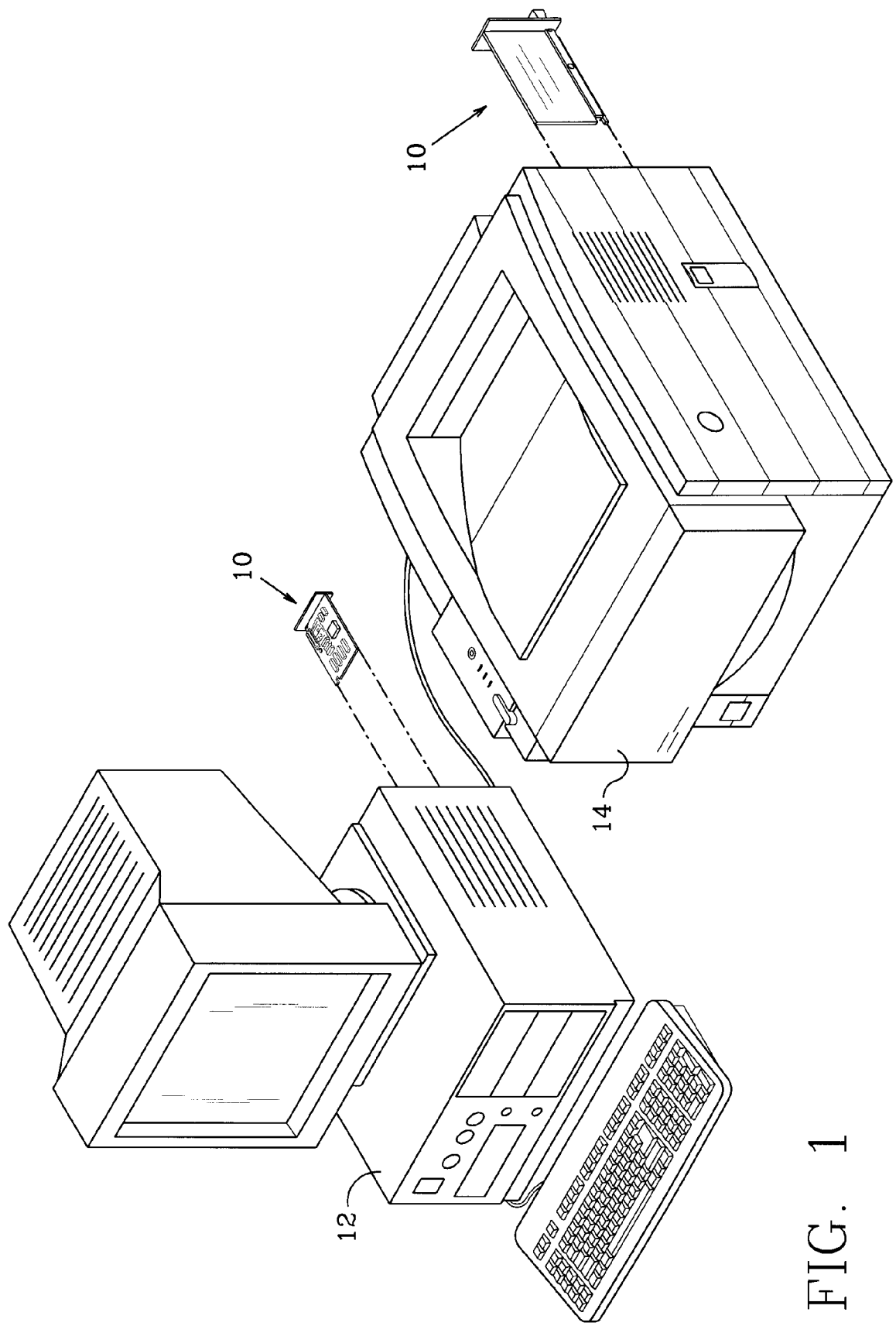
FIG. 1 is a perspective representational view of a computer and attached printer with option cards.

The invention will be described with reference to option cards 10 in a computer 12 and printer 14, as shown in FIG. 1. Two different embodiments of the invented multi-axis interconnection assembly, indicated generally by reference number 16, are shown and described. In the first embodiment, illustrated in FIGS. 2–11, option card 10 pivots up along a side edge to engage the electrical contacts. In the second embodiment, illustrated in FIGS. 12–17, option card 10 pivots down along the back edge to engage the electrical contacts.

Figure 2:
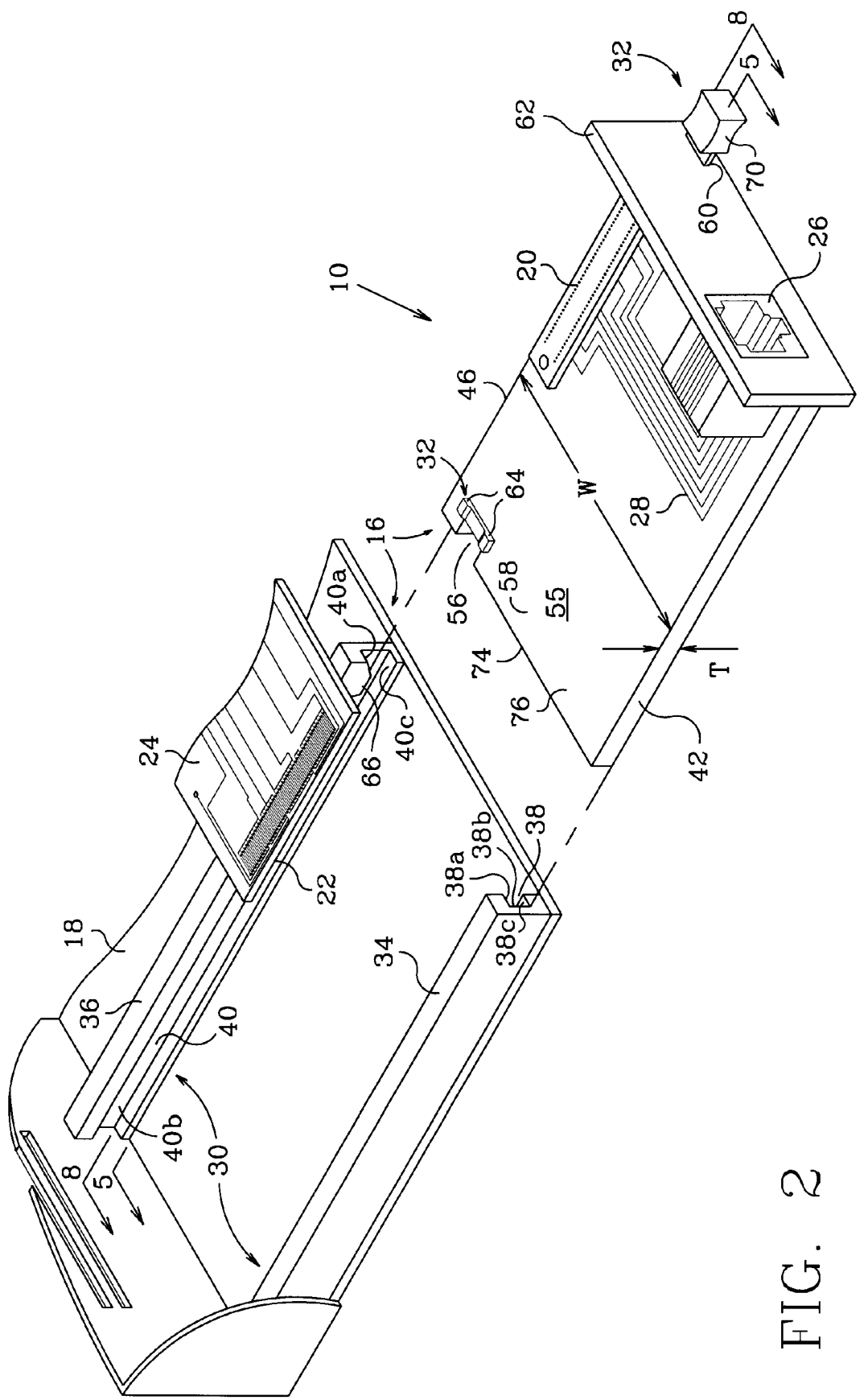
FIG. 2 is a perspective view of a first embodiment of the multi-axis interconnection in which the option card slides in and then pivots up along a side edge to engage the electrical contacts, with the option card in the uninstalled position.
Figure 11:
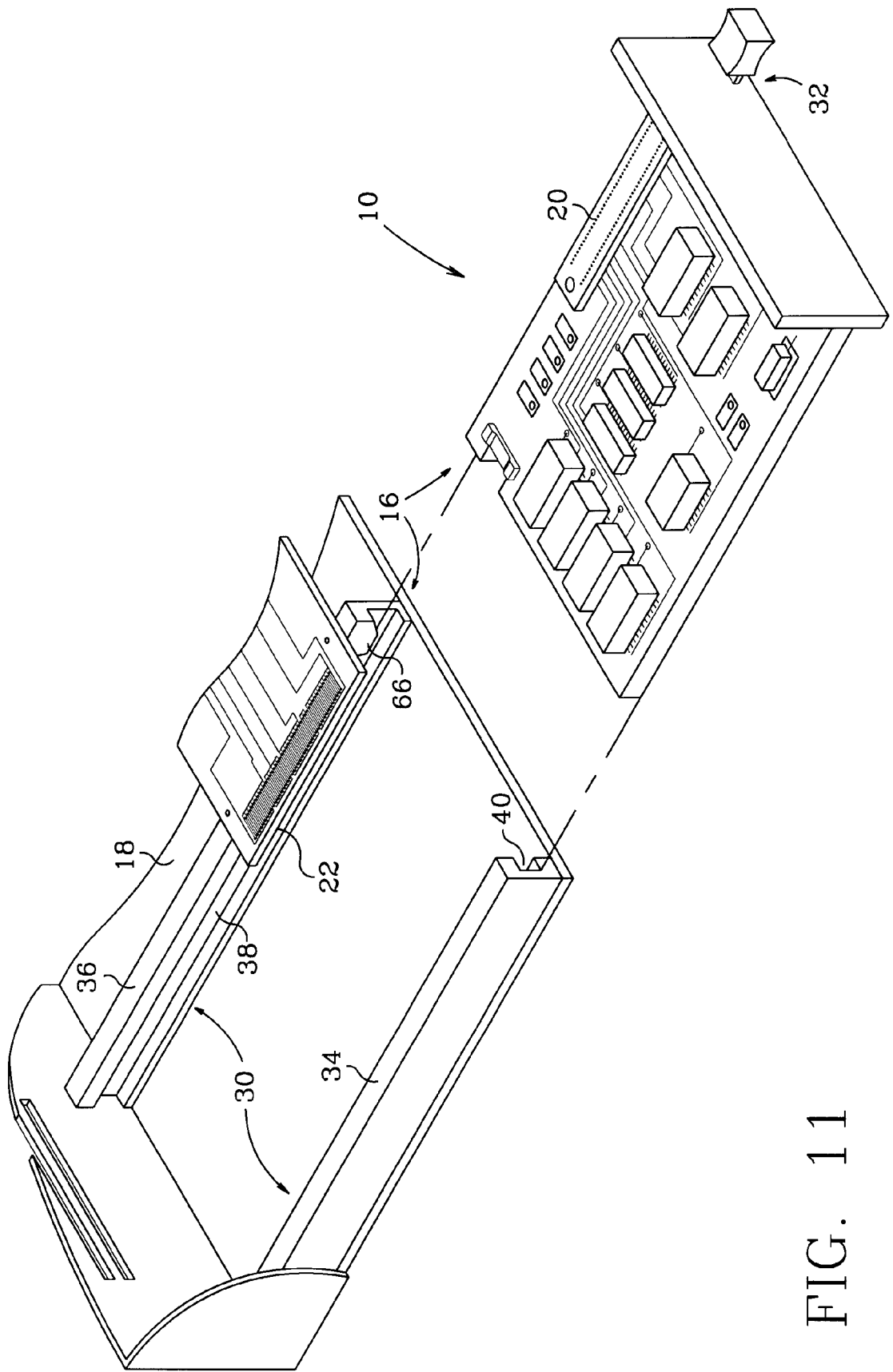
FIG. 11 is a perspective view of the first embodiment of the interconnection in which the option card includes internal circuit elements.
Figure 12:
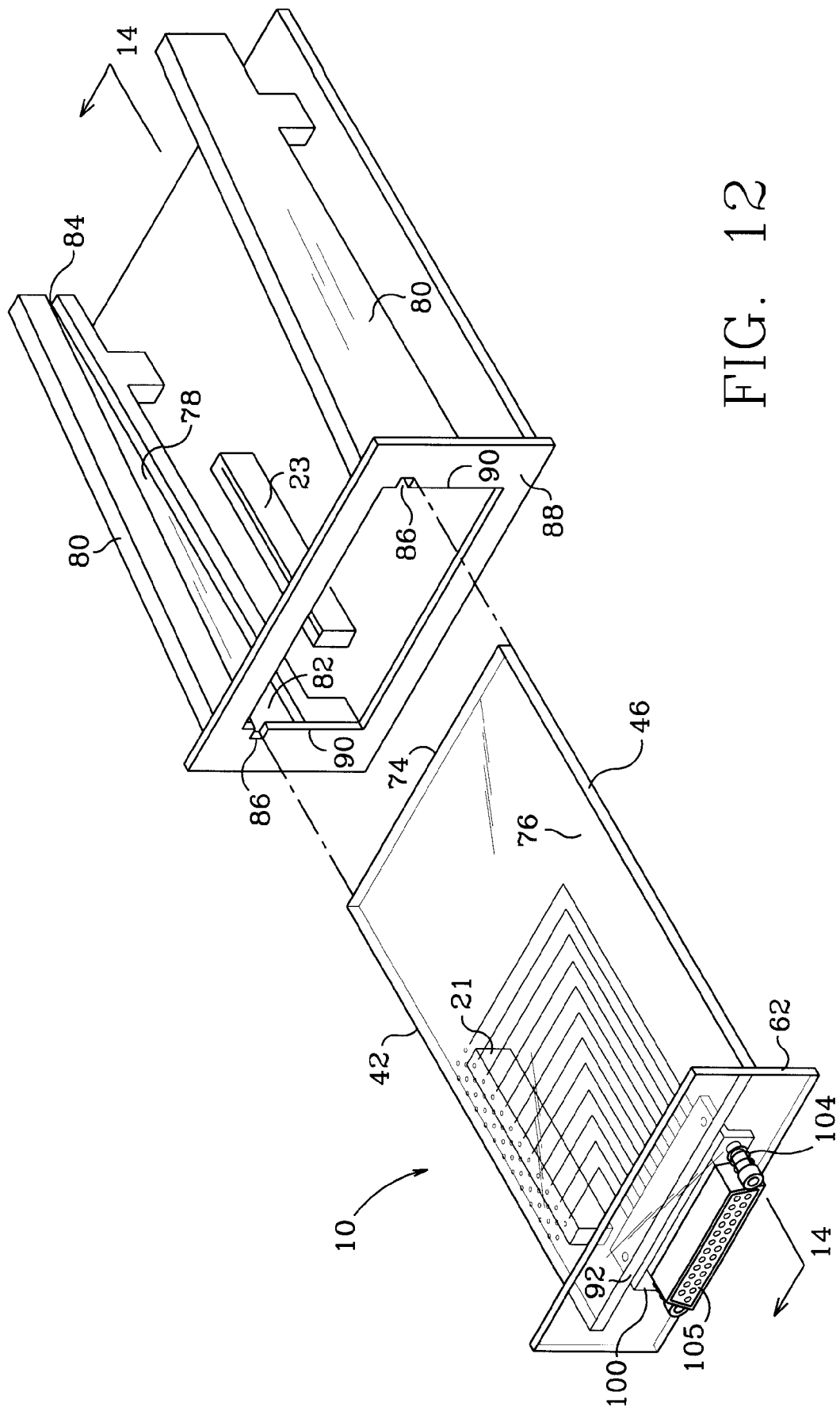
FIG. 12 is a perspective view of a second embodiment of the multi-axis interconnection in which the option card slides in and then pivots down along the back edge to engage the electrical contacts, with the option card in the uninstalled position.
Figure 13:
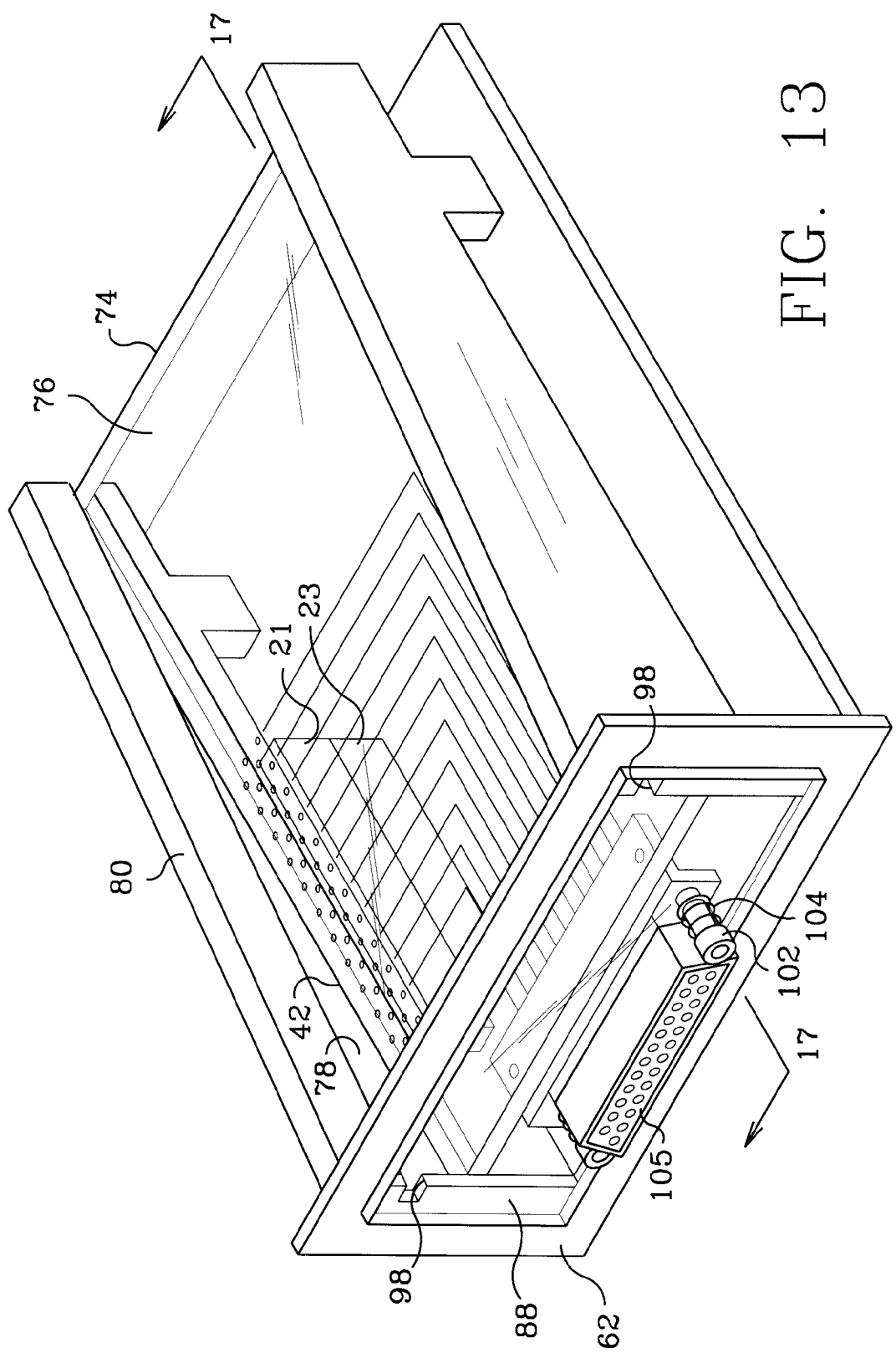
FIG. 13 is a perspective view of the second embodiment of the interconnection with the option card in the fully inserted and engaged position.

Referring first to FIG. 2, the components of multi-axis interconnection 16 are constructed as part of option card 10 and frame 18. Frame 18 represents a bottom or back side panel in the computer 12 or printer 14 of FIG. 1, or other frame members suitable for supporting installation of option card 10. Interconnection 16 operates to engage first electrical contacts 20 on option card 10 and second mating contacts 22 on main circuit board 24. Circuit board 24 represents generally a "mother board" in computer 12, a formatter board in printer 14, or another printed circuit board to which contact must be made by the option card for the option card to perform its desired functions. For the option card 10 shown in FIGS. 2–4, first contacts 20 provide the operative connection between cable jack 26 and main circuit board 24. This type of option card might be used, for example, as a modem card and the like that is connected to an external circuit or peripheral device. For the option card 10 shown in FIG. 11, by contrast, first contacts 20 provide the operative connection between the internal circuit elements 28 on option card 10 and main circuit board 24. The option card of FIG. 11 represents, for example, a logic or similar type of accessory card.

The various components of interconnection 16 will now be described with reference to FIGS. 2–10. Option card 10 is shown sequentially moving from an uninserted position (FIG. 2), to the inserted but unengaged position of FIG. 3, to the engaged position of FIG. 4. FIGS. 5 and 8 are section views taken along the lines 5—5 and 8—8 in the uninserted position of FIG. 2. FIGS. 6 and 9 are section views take along the lines 6—6 and 9—9 of the inserted but unengaged position FIG. 3. FIGS. 7 and 10 are section views taken along the lines 7—7 and 10—10 in the engaged position of FIG. 4.

Referring to FIGS. 2–10, interconnection 16 includes a track 30 and an actuator 32. Track 30 is mounted on frame 18. Actuator 32 is mounted on option card 10. Track 30 includes a left channel guide 34 and a right channel guide 36. Recesses 38 and 40 are formed along the inside of each channel guide 34, 36. Each recess 38, 40 is defined by a top wall 38A, 40A, a side wall 38B, 40B and a bottom wall 38C, 40C. Left channel guide 34 and right channel guide 36 are mounted on frame 18 so that side walls 38B and 40B of recesses 38 and 40 are parallel to one another and spaced apart a distance nominally equal to the width W of option card 10. The height of recess 38 in left channel guide 34, which is the distance between top wall 38A and bottom wall 38C, is nominally equal to the thickness T of option card 10. The height of recess 40 in right channel guide 36, which is the distance between top wall 40A and bottom wall 40C, is substantially greater than the thickness T of option card 10.

The height of recess 40 in right channel guide 36 must be great enough to accommodate the thickness T of option card 10, plus the travel necessary to engage first contacts 20 and second contacts 22. The height of recess 40 in right channel guide 36, therefore, is made sufficient to allow first contacts 20 to pass unimpeded below second contacts 22 as option card 10 slides into track 30. Top wall 38A of left channel guide 34 and top wall 40A of right channel guide 36 lie in the same plane. The height differential between recess 38 in left channel guide 34 and recess 40 in right channel guide 36 is achieved by forming bottom wall 40C in a plane below that of bottom wall 38C in recess 38. Hence, option card 10 slides into track 30 pivoted slightly down from the horizontal plane. As detailed below, option card 10 is pivoted up to engage contacts 20 and 22. Other configurations are possible. For example, if track 30 were mounted above main circuit board 24, then channel guides 34 and 36 would be constructed so that option card 10 slides into track 30 pivoted slightly up from the horizontal plane. In this alternative configuration, option card 10 would then be pivoted down to engage contacts 20 and 22. Similar relative motions could also be used to make connections with vertically oriented option cards.

Referring to the section views of FIGS. 5–10, actuator 32 pivots option card 10 along its left edge 42 to bring option card 10 into the horizontal plane and engage first contacts 20 with second contacts 22, as best seen by comparing FIGS. 6 and 7. Actuator 32 includes a slide plate 48 positioned between option card 10 and frame 18. Openings 50A and 50B are formed in the right edge 46 of option card 10. Bumps 52A and 52B on slide plate 48 extend into openings 50A and 50B when contacts 20 and 22 are not engaged, as shown in FIGS. 5–6. Bumps 52A and 52B bear on the bottom side of the right edge 46 of option card 10 when contacts 20 and 22 are engaged, as shown in FIGS. 7 and 10. It may be advantageous in some applications for interconnection 16 to make opening 50A slightly longer than opening 50B, as shown in FIGS. 5–10. In this configuration, bump 52B will bear on option card 10 before bump 52A and move the back portion of the contacts together. Bump 52A will thereafter begin to bear on option card 10 to "roll" the front portion of the contacts together. The sequence of engagement of contacts 20 and 22 can be controlled as may be necessary or desireable by the combined effects of the size, shape and location of openings 50A and 50B and bumps 52A and 52B.

Figure 3:
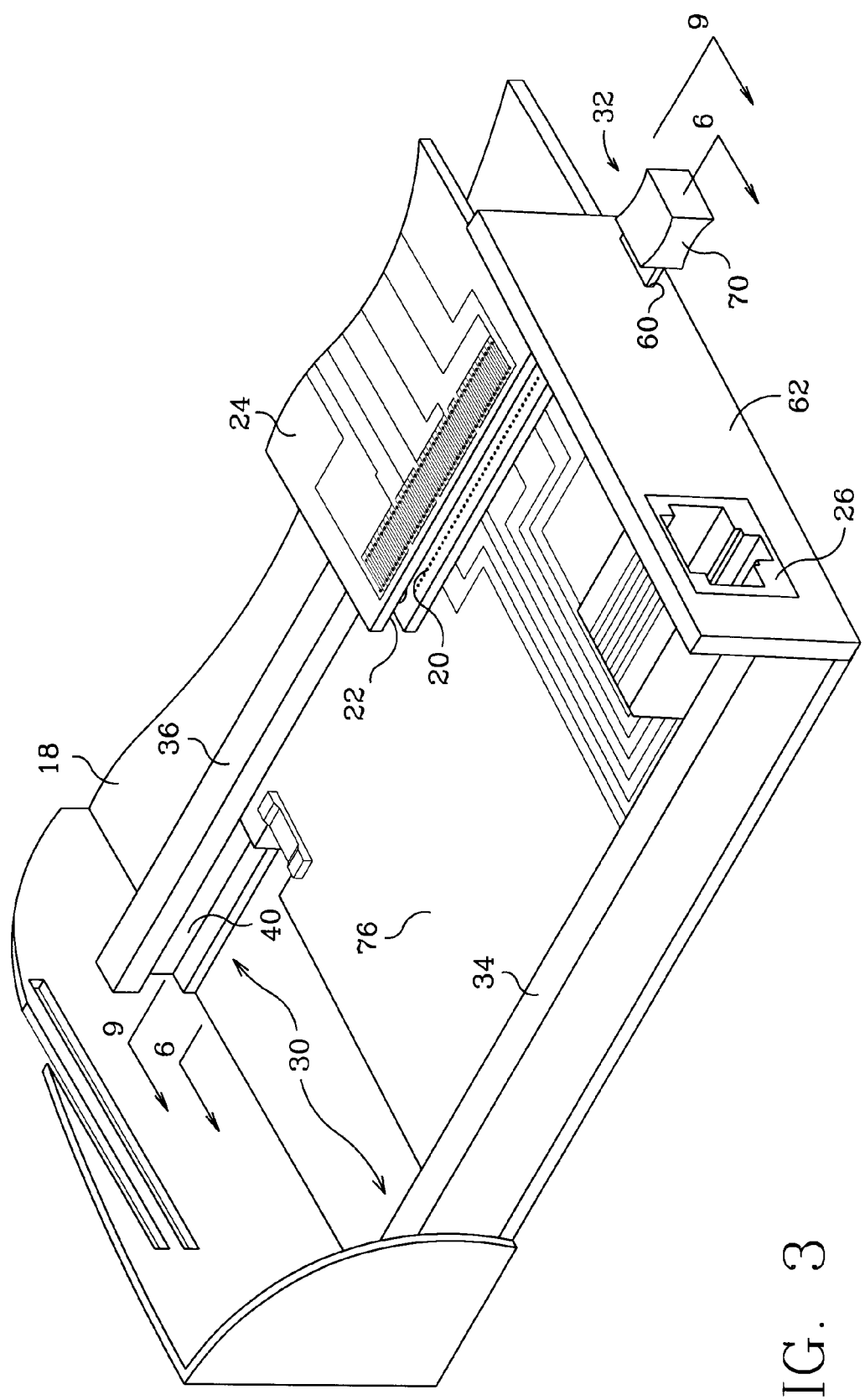
FIG. 3 is a perspective view of the first embodiment of the interconnection with the option card in the fully inserted but disengaged position.

Referring to FIGS. 2 and 3, a notch 56 at the back portion 58 of option card 10 and a notch 60 in the face plate 62 of option card 10 serve as guides for slide plate 48. The forward portion of slide plate 48 rests in notch 60. Tabs 64 on the back portion of slide plate 60 hold slide plate 48 in notch 56. Referring to FIGS. 5 and 8–10, a clearance tab 66 projects down from top wall 40A of right channel guide 36 at the forward portion of right channel guide 36. As shown in FIGS. 5 and 8, tab 66 bears on the top side 55 of the right edge 46 of option card 10 as option card 10 is installed in track 30. Tab 66 assures adequate clearance between first and second contacts 20 and 22 as option card 10 is inserted. As shown in FIGS. 9 and 10, tab 66 extends into notch 68 in the forward portion of right edge 46 of option card 10 when option card 10 is fully inserted to allow option card 10 to pivot up and engage contacts 20 and 22.

Figure 4:
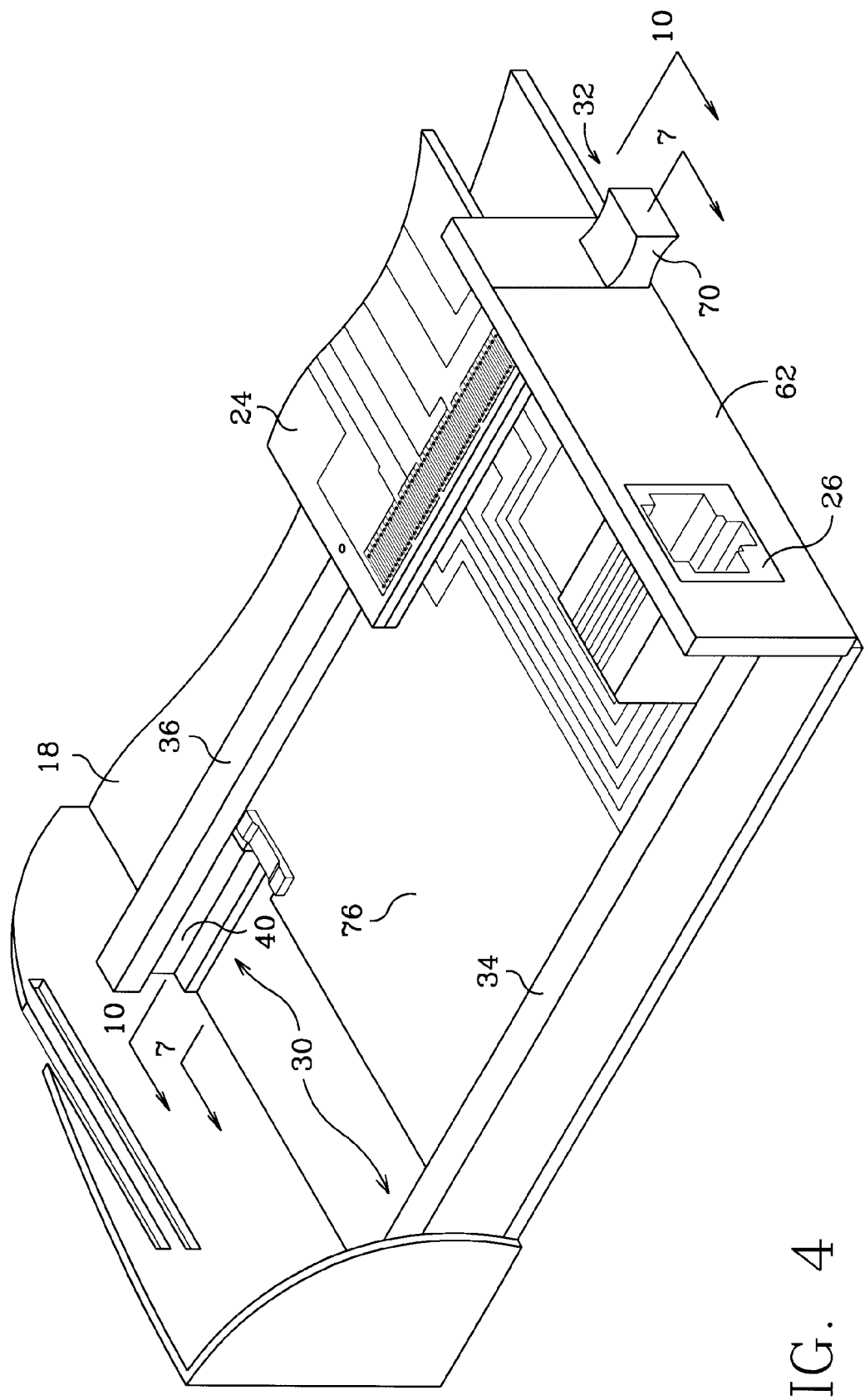
FIG. 4 is a perspective view of the first embodiment of the interconnection with the option card in the fully inserted and engaged position.

In operation, and referring first to the uninserted position shown in FIGS. 2, 5 and 8, slide plate 48 is in a retracted position. Bumps 52 on slide plate 48 extend into openings 50 in the right edge 46 of option card 10. Option card 10 is inserted into track 30 as shown in FIGS. 3, 6, and 9. In this fully inserted, but still disengaged position, the clearance between first and second contacts 20 and 22 is maintained, as best seen in FIGS. 6 and 9. Slide plate 48 remains in the retracted position, but tab 66 on the top wall 40A of right channel guide 36 is now aligned with notch 68 in the right edge 46 of option card 10. Hence, interconnection 16 is now in position to engage first and second contacts 20 and 22. To engage the contacts, slide plate 48 is moved forward by pushing button 70, as shown in FIGS. 4, 7 and 10. As slide plate 48 moves forward, bumps 52 move out of openings 50 to bear on the right edge 46 of option card 10 to pivot option card 10 up and push first contacts 20 into contact with second contacts 22.

First and second contacts 20 and 22 are disengaged and option card 10 removed from track 30 by reversing the installation steps. That is, slide plate 48 is retracted by pulling on button 70 to bring bumps 52 into alignment with openings 50. If socket type connectors are used, it may be necessary to push down on the right hand side of option card 10, for example by pushing down on face plate 62, to disengage the contacts. It may be desirable in some applications, therefore, to include a biasing mechanism to help disengage socket connectors when slide plate 48 is retracted.

In many applications for interconnection 16, it may be desirable to ground the electronic components of option card 10 as option card 10 is inserted into the computer or printer. Grounding is provided by constructing slide plate 48 of conductive material and by making a contact between slide plate 48 and a ground line in the circuitry of option card 10. This ground contact is easily established where tabs 64 at the back of slide plate 48 contact option card 10 at notch 56. Option card 10 is grounded when slide plate 48 contacts frame 18 as option card 10 is inserted into track 30 or when slide plate 48 is driven forward to engage electrical contacts 20 and 22. Alternatively, discrete grounding plates may be installed at any location along the bottom side of option card 10. Grounding option card 10 before engagement of electrical contacts 20 and 22 minimizes the problems associated with signal line grounding that may occur with conventional edge connectors.

Figure 14:
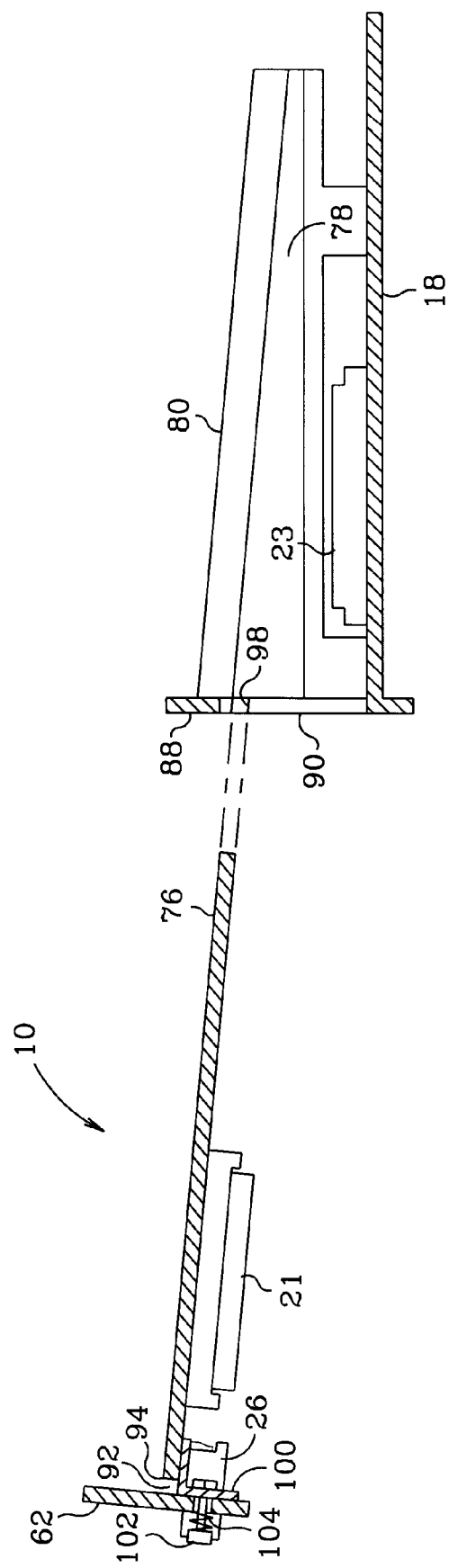
FIGS. 14–17 are section views of the second embodiment of the interconnection showing insertion of the option card and engagement of the electrical contacts.
Figure 15:
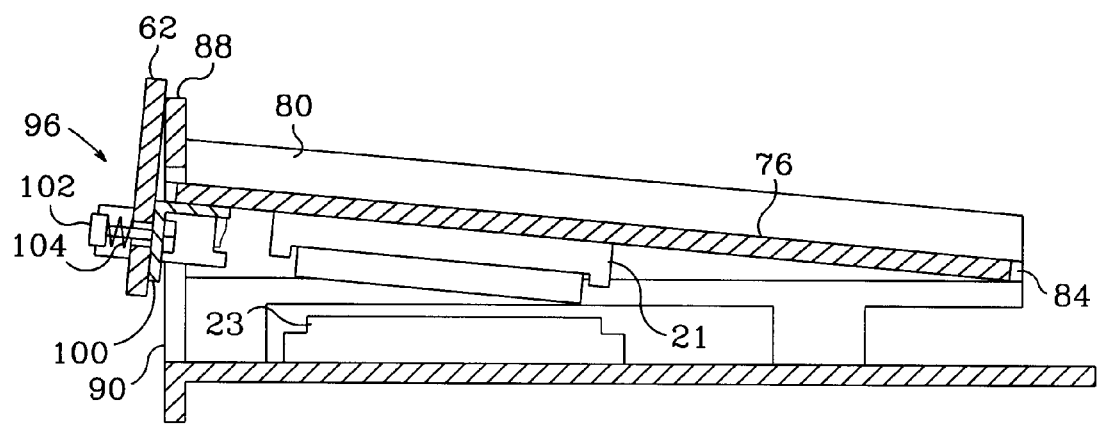
Figure 16:
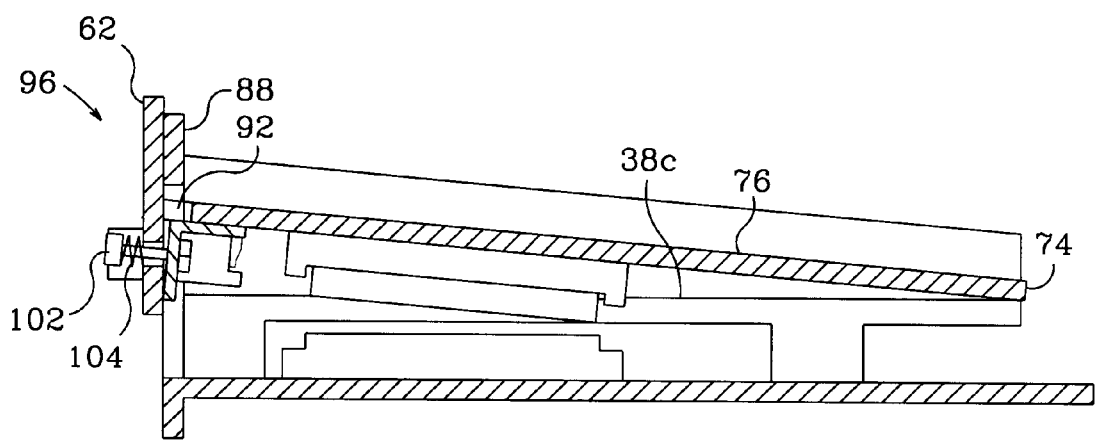
Figure 17:
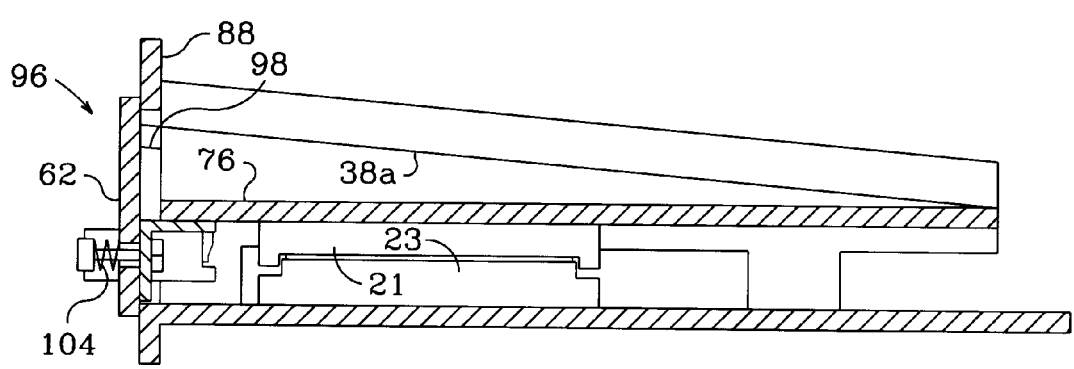

In a second embodiment of interconnection 16 illustrated in FIGS. 12–17, option card 10 rotates or pivots along its back edge 74 to connect and disconnect socket type connectors 21 and 23. In FIGS. 12–17, the body 76 of option card 10 is made transparent to better illustrate the structure and operation of interconnection 16. In practice, option card 10 would not be transparent. Option card 10 is shown in the uninserted position in FIG. 12 and the fully inserted and engaged position in FIG. 13. FIGS. 14 and 17 are section views of option card 10 in the uninserted and fully inserted and engaged positions, respectively. The section views of FIGS. 15 and 16 show option card 10 at intermediate positions between the uninserted position of FIG. 14 and the fully inserted and engaged position of FIG. 17.

In this second embodiment, track 30 includes identical V-shaped recesses 78 in both channel guides 80. Recesses 78 taper from a comparatively broad front portion 82 to a narrow back portion 84. The height of back portion 84 of recesses 78 is nominally equal to the thickness T of option card 10. The height of front portion 82 of recesses 78 must be great enough to accommodate the thickness T of option card 10, plus the travel necessary to engage first connector 21 on option card 10 with second connector 23 on main circuit board 24. The height of front portion 82, therefore, is sufficient to allow first connector 21 to pass unimpeded above second connector 23 as option card 10 slides along track 30.

Opposing notches 86 in the face 88 of frame 18 support and guide option card 10 during installation. Notches 86 are positioned at the top of recesses 78. Once option card 10 is inserted into track 30, as shown in FIG. 15, connectors 21 and 23 are connected by pushing option card 10 down to the engaged position shown in FIG. 17. Option card 10 pivots along its rear edge 74 to "roll" connectors 21 and 23 together so that the electrical contacts at the rear of connectors 21 and 23 are engaged first, followed by the more forward contacts. Vertical edges 90 in frame face 88 slide along a gap 92 between the forward edge 94 of option card 10 and face plate 62. A locking mechanism 96 may be used to help keep option card 10 in the engaged position of FIG. 17. Locking mechanism 96 includes the beveled top corners 98 of vertical edges 90, spacer 100, pins 102 and springs 104. Spacer 100 is connected between the body 76 of option card 10 and face plate 62. In this embodiment, spacer 100 is the mounting bracket on cable connector 105. Face plate 62 is spring loaded against spacer 100 through springs 104 on pins 102. This spring loading is transferred from spacer 100 to frame face 88 when option card 10 is installed in track 30 to retard the upward movement of option card 10 once it is fully installed in track 30.

The position of notches 86 and the angled recesses 78 combine to bring option card 10 into track 30 at an angle relative the vertical frame face 88. The top of option card face plate 62, therefore, engages frame face 88 to prevent further insertion of option card 10, as shown in FIG. 15. In this position, the forward corners of option card 10 (at forward edge 94) rest on the beveled top corners 98 of the vertical edges 90 of face 88. As option card face plate 62 is pushed down, beveled corners 98 drive option card 10 rearward and compress springs 104 as face plate 62 becomes flush with frame face 88, as shown in FIGS. 16 and 17. Connectors 21 and 23 are disconnected by lifting option card 10. Option card 10 is then removed by withdrawing it from track 30.

The invention has been shown and described with reference to the installation of option cards in computers and printers. The invention, however, is not limited to option cards or computers and printers. The invention may be used to install other types of circuit cards in other pieces of equipment. Memory modules, LAN interfaces, disk drives and electrical bus lines, for example, could be installed using the interconnection of the present invention. It will, therefore, be understood that these and other modifications and variations are possible without departing from the scope of the invention as defined in the following claims.

What is claimed is:

1. A multi-axis interconnection assembly, comprising:

an electronic device having a frame and a circuit board fastened in the frame;

electrical contacts on the circuit board;

a circuit card;

electrical contacts on the circuit card;

an elongated track mounted to the frame, the circuit card slidable in the track and the circuit card pivotable in the track between a first position in which the contacts are not engaged and a second position in which the contacts are engaged; and an actuator operatively coupled to the circuit card, the actuator movable between a first position in which the contacts are not engaged and a second position in which the contacts are engaged.

2. The interconnection assembly according to claim 1, wherein the actuator comprises a movable bump disposed between the frame and the side edge of the circuit card, the bump bearing on the side edge of the circuit card to pivot the circuit card from the first position to the second position as the actuator moves between the first position and the second position.

3. The interconnection assembly according to claim 2, wherein the actuator further comprises an opening in the side edge of the circuit card, the bump extending into the opening when the actuator is in the first position.

* * * * *